(12) United States Patent
Cho et al.

(10) Patent No.: US 7,280,383 B2
(45) Date of Patent: Oct. 9, 2007

(54) SEMICONDUCTOR MEMORY DEVICE AND A METHOD FOR ARRANGING SIGNAL LINES THEREOF

(75) Inventors: Young-Chul Cho, Suwon-si (KR); Sung-Hoon Kim, Seongnam-si (KR); Joung-Yeal Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/262,530

(22) Filed: Oct. 28, 2005

(65) Prior Publication Data

US 2006/0092682 A1    May 4, 2006

(30) Foreign Application Priority Data

Oct. 29, 2004   (KR) ...................... 10-2004-0087524

(51) Int. Cl.
  *G11C 5/06* (2006.01)
(52) U.S. Cl. ....................................................... 365/63
(58) Field of Classification Search .................. 365/63
  See application file for complete search history.

(56) References Cited

U.S. PATENT DOCUMENTS

| | | | |
|---|---|---|---|
| 5,400,274 A * | 3/1995 | Jones et al. .................... | 365/63 |
| 5,726,596 A | 3/1998 | Perez | |
| 5,886,943 A * | 3/1999 | Sekiguchi et al. ..... | 365/230.03 |
| 6,125,419 A | 9/2000 | Umemura et al. | |
| 6,728,125 B2 * | 4/2004 | Hong ........................... | 365/51 |
| 6,831,862 B2 * | 12/2004 | Tedrow et al. ......... | 365/185.21 |

FOREIGN PATENT DOCUMENTS

JP          07-154041          6/1995

* cited by examiner

*Primary Examiner*—Amir Zarabian
*Assistant Examiner*—Anthan T Tran
(74) *Attorney, Agent, or Firm*—F. Chau & Assoc., LLC (57) ABSTRACT

The present invention discloses a semiconductor memory device and a method for arranging signal lines thereof. The semiconductor memory device including a first memory cell array, an IO control circuit and a second memory cell array arranged between the first memory cell array and the IO control circuit, includes: first IO signal lines for transmitting data between the first memory cell array and the IO control circuit, wherein the first IO signal lines are connected to first data loading locations of the first memory cell array and extend in a straight line to the IO control circuit; and second IO signal lines for transmitting data between the second memory cell array and the IO control circuit, wherein the second IO signal lines are connected to first data loading locations of the second memory cell array and extend to the IO control circuit, wherein lengths of the first IO signal lines starting from the first data loading locations of the first memory cell array to the IO control circuit are identical to lengths of the second IO signal lines starting from the first data loading locations of the second memory cell array to the IO control circuit.

16 Claims, 5 Drawing Sheets

SEMICONDUCTOR MEMORY DEVICE AND A METHOD FOR ARRANGING SIGNAL LINES THEREOF

CROSS-REFERENCE TO RELATED APPLICATION

This application claims priority to Korean Patent Application No. 2004-87524, filed Oct. 29, 2004, the disclosure of which is incorporated by reference herein in its entirety.

BACKGROUND OF THE INVENTION

1. Technical Field

The present invention relates to a semiconductor memory device and, more particularly, to a semiconductor memory device which can remove a skew occurring between data signals transmitted through global data input/output (IO) signal lines of different lengths, and a method for arranging signal lines thereof.

2. Discussion of the Related Art

A conventional semiconductor memory device typically includes a memory cell array region, a column decoder region, an IO control signal region, and a peripheral circuit region. The semiconductor memory device also includes local and global data IO lines for transmitting data signals from the memory cell array region to the IO control signal region. The local data IO lines are arranged in the same direction as word lines and are located above the memory cell array region. The global data IO lines are arranged in a direction perpendicular to the local data IO lines and are located above the memory cell array region and the column decoder region. Because lengths of the global data IO lines differ according to the location of the memory cell arrays the semiconductor memory device tends to have a skew between signals of those lines.

Figure 1:
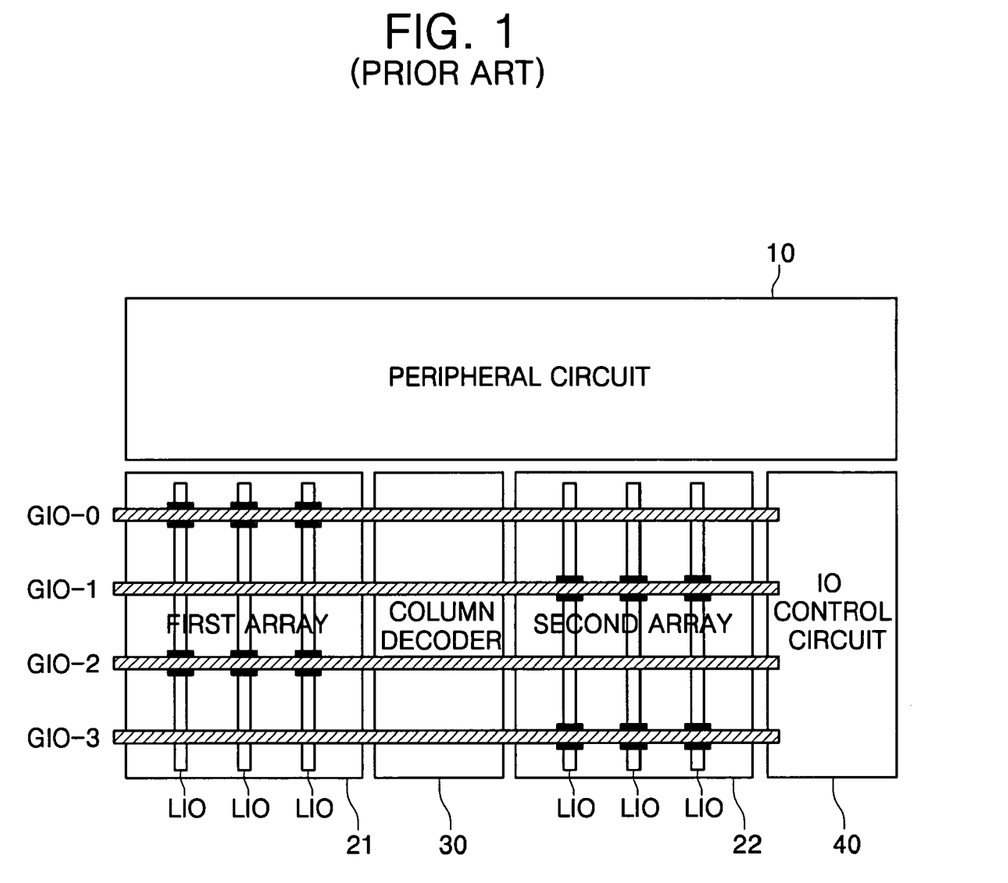
FIG. 1 is a schematic view illustrating a signal line arrangement of a conventional semiconductor memory device.

FIG. 1 is a schematic view illustrating a signal line arrangement of a conventional semiconductor memory device. As shown in FIG. 1, the semiconductor memory device includes a peripheral circuit 10, first and second memory cell arrays 21 and 22, a column decoder 30, and an IO control circuit 40. The semiconductor device also includes local data IO signal lines LIO and global data IO signal lines GIO0 to GIO3.

As shown in FIG. 1, non-hatched signal lines are arranged on a first layer, and hatched signal lines are arranged on a second layer. The IO control circuit 40 includes an IO sense amplifier (not shown) for amplifying signals to be inputted/outputted through the global data IO signal lines GIO-0 to GIO-3, a precharge circuit (not shown) for precharging the global data IO signal lines GIO-0 to GIO-3 in response to a precharge command, and a data IO multiplexer (not shown) for transmitting data signals between the IO sense amplifier and the global data IO signal lines GIO-0 to GIO-3.

The peripheral circuit 10, which may include a row decoder (not shown), decodes a row address to generate a word line selecting signal. The first and second memory cell arrays 21 and 22 write/read data to/from a memory cell (not shown) which is selected in response to a column selecting signal inputted from the column decoder 30 and the word line selecting signal inputted from the peripheral circuit 10. The column decoder 30 decodes a column address to output the column selecting signal. In addition, the column decoder 30 disables the column selecting signal in response to a precharge command inputted from the IO control circuit 40 during a precharge operation. The IO control circuit 40 amplifies the data signals inputted/outputted through the global data IO signal lines GIO-0 to GIO-3 and precharges the global data IO signal lines GIO-0 to GIO-3.

As further shown in FIG. 1, the column decoder 30 is arranged between the first and second memory cell arrays 21 and 22 and the IO control circuit 40 is arranged on an opposite side of the column decoder 30. The second memory cell array 22 is located between the IO control circuit 40 and the column decoder 30 and the peripheral circuit 10 is arranged on an upper side of the first and second memory cell arrays 21 and 22.

The local data IO signal lines LIO are arranged in a vertical direction on the first layer above regions of the first and second memory cell arrays 21 and 22, and the global data IO signal lines GIO-0 to GIO-3 are arranged horizontally and are placed in a vertical direction with respect to the local data IO signal lines LIO above the first and second memory cell array 21 and 22 regions and a region of the column decoder 30. The global data IO signal lines GIO-0 and GIO-2 are connected to the local data IO signal lines LIO above the first memory cell array 21 region, and the global data IO signal lines GIO-1 and GIO-3 are connected to the local data IO signal lines LIO above the second memory cell array 22 region.

If the global data IO signal lines GIO-0 to GIO-3 are arranged as shown in FIG. 1, a skew occurs between data outputted from the first and second memory cell arrays 21 and 22.

For example, data outputted from the first memory cell array 21 passes through the column decoder 30 region and the second memory cell array 22 region to reach the IO control circuit 40 through the global data IO signal lines GIO-0 and GIO-2. However, data outputted from the second memory cell array 22 directly reaches the IO control circuit 40 through the global data IO signal lines GIO-1 and GIO-3 without passing through the column decoder 30 region. Thus, a skew occurs between data outputted from the first and second memory cell arrays 21 and 22. The resulting skew can cause an abnormal operation of the semiconductor memory device if it exceeds, for example, a predetermined limit, and since the operation speed of the semiconductor device is high, the predetermined limit is smaller, thus an increase in the number of abnormal operations may occur.

Referring back to FIG. 1, during a precharge operation for precharging the global data IO signal lines GIO-0 to GIO-3 to a predetermined level, the column selecting signal outputted from the column decoder 30 should be disabled before the global data IO signal lines GIO-0 to GIO-3 are precharged. To do this, the column decoder 30 disables the column selecting signal in response to the precharge command outputted from the IO control circuit 40.

However, since the column decoder 30 is arranged between the first and second memory cell arrays 21 and 22, the column decoder 30 is farther from the IO control circuit 40 than the second memory cell array 22. Thus, the IO signal lines which exist in the second memory cell array 22 region may be precharged before the column selecting signal is disabled. As such, a need exists for a semiconductor memory device that can remove a skew between data signals transmitted through global IO signal lines and that efficiently precharges IO signal lines.

SUMMARY OF THE INVENTION

It is an object of the present invention to provide a semiconductor memory device and a method for arranging signal lines thereof which can remove a skew occurring between data signals transmitted through global data IO signal lines due to memory cell array location in the device and that can prevent an abnormal operation which may occur during a precharge operation.

In one embodiment of the present invention a semiconductor memory device is provided that includes a first memory cell array, an IO control circuit and a second memory cell array arranged between the first memory cell array and the IO control circuit, including: first IO signal lines for transmitting data between the first memory cell array and the IO control circuit, wherein the first IO signal lines are connected to first data loading locations of the first memory cell array and extend in a straight line to the IO control circuit; and second IO signal lines for transmitting data between the second memory cell array and the IO control circuit, wherein the second IO signal lines are connected to first data loading locations of the second memory cell array and extend to the IO control circuit, wherein lengths of the first IO signal lines starting from the first data loading locations of the first memory cell array to the IO control circuit are identical to lengths of the second IO signal lines starting from the first data loading locations of the second memory cell array to the IO control circuit.

The second IO signal lines are arranged to extend from one side of the second memory cell array adjacent to the IO control circuit to an opposite side of the second memory cell array and from the opposite side of the second memory cell array back to the IO control circuit.

The semiconductor memory device further includes a column decoder for outputting a column selecting signal in response to an external address signal, wherein the column decoder is arranged between the first and second memory cell arrays.

In another embodiment of the present invention, a semiconductor memory device including a first memory cell array, an IO control circuit and a second memory cell array arranged between the first memory cell array and the IO control circuit, includes first local data IO signal lines arranged above the first memory cell array; second local data IO signal lines arranged on the same layer and in the same direction as the first local data IO signal lines above the second memory cell array; first global data IO signal lines connected to the first local data IO signal lines and arranged in a perpendicular direction to the first and second local data IO signal lines to extend from the first memory cell array to the IO control circuit; and second global data IO signal lines connected to the second local data IO signal lines arranged to extend from one side of a region of the second memory cell array adjacent to the IO control circuit to an opposite side of the second memory cell array region and from the opposite side of the second memory cell array region back to the IO control circuit, wherein the first and second global data IO signal lines are arranged on different layers than the first and second local data IO signal lines.

The first and second global data IO signal lines are arranged on the same layer.

The semiconductor memory device further includes a peripheral circuit arranged on one side of the first and second memory cell arrays and the IO control circuit, wherein a portion of one of the second global data IO signal lines beginning from the opposite side of the second memory cell array region extends back to the IO control circuit through a region of the peripheral circuit.

The first global data IO signal lines are arranged such that portions above a region of the first memory cell array are arranged on the same layer as portions of the second global data IO signal lines extending back to the IO control circuit from the opposite side of the second memory cell array region and portions above the second memory cell array region are arranged on a different layer than portions of the second global data IO signal lines extending from the side of the second memory cell array region adjacent to the IO control circuit.

The second global data IO signal lines are arranged such that portions of the second global data IO signal lines extending from the side of the second memory cell array region adjacent to the IO control circuit and portions of the second global data IO signal lines extending back to the IO control circuit from the opposite side of the second memory cell array region are arranged on different layers.

The first global data IO lines are arranged on the same layer as the portions of the second global data IO signal lines extending from the side of the second memory cell array region adjacent to the IO control circuit.

The first global data IO lines are arranged on the same layer as the portions of the second global data IO signal lines extending back to the IO control circuit from the opposite side of the second memory cell array region.

The first global data IO signal lines are arranged such that portions above a region of the first memory cell array are arranged on the same layer as the portion of the second global data IO signal lines extending back to the IO control circuit from the opposite side of the second memory cell array region and portions above the second memory cell array region are arranged on the same layer as the portion of the second global data IO signal lines extending from the side of the second memory cell array region adjacent to the IO control circuit.

The semiconductor memory device further includes a column decoder for outputting a column selecting signal in response to an external address signal, wherein the column decoder is arranged between the first and second memory cell arrays.

The present invention further provides a method for arranging signal lines of a semiconductor memory device including a first memory cell array, an IO control circuit and a second memory cell array arranged between the first memory cell array and the IO control circuit, including: arranging first local data IO signal lines above the first memory cell array; arranging second local data IO signal lines above the second memory cell array in the same direction and in the same direction as the first local data IO signal lines; arranging first global data IO signal lines connected to the first local data IO signal lines in a perpendicular direction to the first and second local data IO signal lines from the first memory cell array to the IO control circuit; and arranging second global data IO signal lines connected to the second local data IO signal lines to extend from one side of a region of the second memory cell array adjacent to the IO control circuit to an opposite side of the second memory cell array region and from the opposite side of the second memory cell array region back to the IO control circuit, wherein the first and second global data IO signal lines are arranged on a different layer than the first and second local data IO signal lines.

The first and second global data IO signal lines are arranged on the same layer.

The signal line arrangement method further includes arranging a peripheral circuit having a row decoder on one side of the first and second memory cell arrays and the IO control circuit, wherein a portion of one of the second global data IO signal lines beginning from the opposite side of the second memory cell array region extends back to the IO control circuit through a region of the peripheral circuit.

The first global data IO signal lines are arranged such that portions above a region of the first memory cell array are arranged on the same layer as portions of the second global data IO signal lines extending back to the IO control circuit from the opposite side of the second memory cell array region and portions above the second memory cell array region are arranged on a different layer than the second global data IO signal lines extending from the side of the second memory cell array region adjacent to the IO control circuit.

The second global data IO signal lines are arranged such that portions of the second global data IO signal lines extending from the side of the second memory cell array region adjacent to the IO control circuit and portions of the second global data IO signal lines extending back to the IO control circuit from the opposite side of the second memory cell array region are arranged on different layers.

The first global data IO lines are arranged on the same layer as the portions of the second global data IO signal lines extending from the side of the second memory cell array region adjacent to the IO control circuit.

The first global data lines are arranged on the same layer as the portions of the second global data IO signal lines extending back to the IO control circuit from the opposite side of the second memory cell array region.

The first global data IO signal lines are arranged such that portions above a region of the first memory cell array are arranged on the same layer as the portion of the second global data IO signal lines extending back to the IO control circuit from the opposite side of the second memory cell array region and portions above the second memory cell array region are arranged on the same layer as the portion of the second global data IO signal lines extending from the side of the memory cell array region adjacent to the IO control circuit.

The signal line arrangement method further includes arranging a column decoder for outputting a column selecting signal in response to an external address signal between the first and second memory cell arrays.

BRIEF DESCRIPTION OF THE DRAWINGS

The above and other features of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
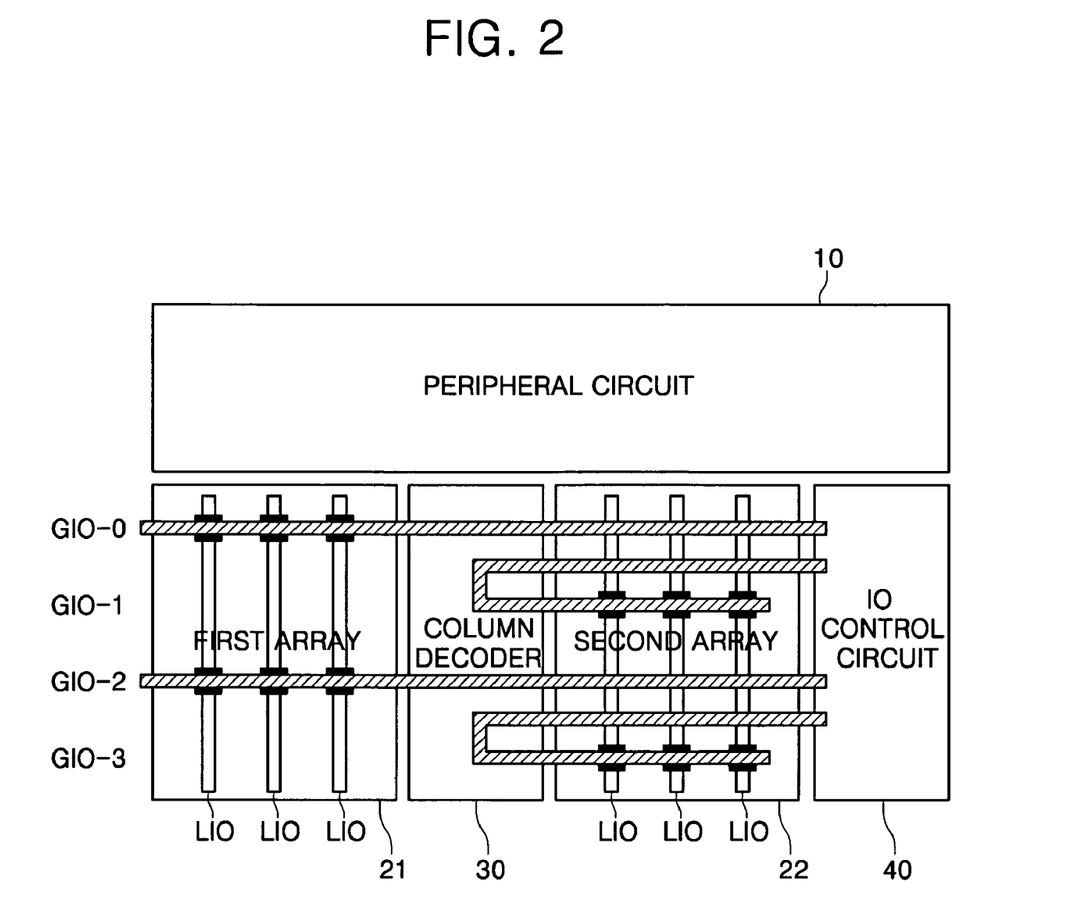
FIG. 2 is a schematic view illustrating a signal line arrangement of a semiconductor memory device according to a first exemplary embodiment of the present invention.

FIG. 2 is a schematic view illustrating a signal line arrangement of a semiconductor memory device according to a first embodiment of the present invention.

The function and arrangement of a peripheral circuit 10, first and second memory cell arrays 21 and 22, and IO control circuit 40 of FIG. 2 are the same or similar to those described above with reference to FIG. 1. In addition, the local data IO signal lines LIO of FIG. 2 are arranged in the same or similar fashion as shown in FIG. 1. As in FIG. 1, non-hatched signal lines are arranged on the first layer and hatched signal lines are arranged on the second layer. Global data IO signal lines GIO-0 and GIO-2, which are connected to the local data IO signal lines LIO above the first memory cell array 21 region, are also arranged in the same or similar way as shown in FIG. 1.

As shown in FIG. 2, global data IO signal lines GIO-1 and GIO-3, which are connected to the local data IO signal lines LIO above the second memory cell array 22 region, are arranged such that they extend to the column decoder 30 region from the IO control circuit 40 through the second memory cell array 22 region without being connected to the local data IO signal lines LIO. The global IO signal lines GIO-1 to GIO-3 take a U-like turn above the column decoder 30 region, and then extend to the second memory cell array 22 region from the column decoder 30 region to be connected to the local data IO signal lines LIO above the second memory cell array 22 region.

As a result, lengths of the global data IO signal lines GIO-0 and GIO-2 starting from portions connected to the local data IO signal lines LIO above the first memory cell array 21 region to the IO control circuit 40 are identical to lengths of the global data IO signal lines GIO-1 and GIO-3 starting from portions connected to the local data IO signal lines LIO above the second memory cell array 22 region to the IO control circuit 40. Thus, a skew between data signals transmitted through the global data IO signal lines GIO-0 to GIO-3 between the IO control circuit 40 and the first and second memory cell arrays 21 and 22 does not occur. In addition, the global data IO signal lines GIO-0 to GIO-3 may be precharged after the column selecting signal is disabled during a precharge operation.

Figure 3:
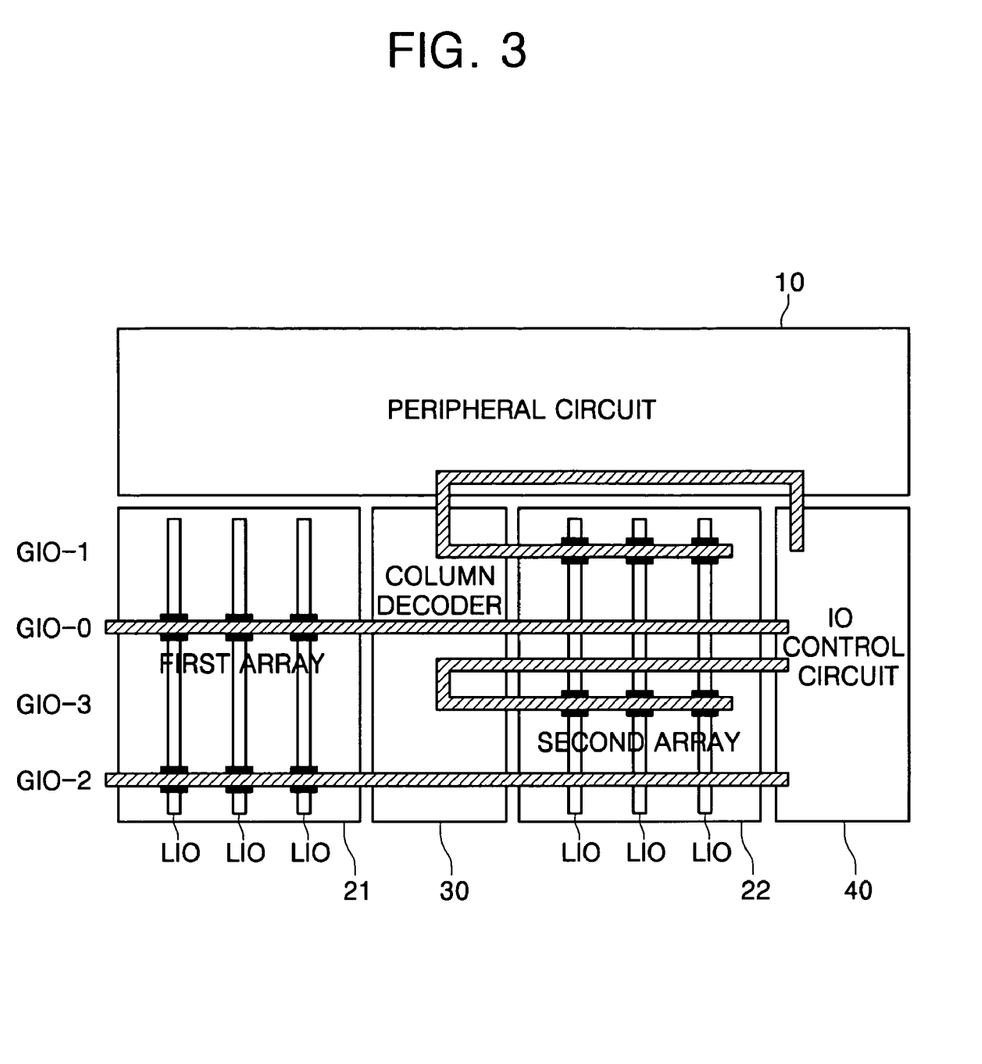
FIG. 3 is a schematic view illustrating a signal line arrangement of a semiconductor memory device according to a second exemplary embodiment of the present invention.

FIG. 3 is a schematic view illustrating a signal line arrangement of a semiconductor memory device according to a second embodiment of the present invention. The function and arrangement of a peripheral circuit 10, first and second memory cell arrays 21 and 22, and IO control circuit 40 of FIG. 3 are the same or similar to those described above with reference to FIG. 1. In addition, the local data IO signal lines LIO of FIG. 3 are arranged in the same or similar fashion as shown in FIG. 1. As in FIG. 1, non-hatched signal lines are arranged on the first layer and hatched signal lines are arranged on the second layer.

As shown in FIG. 3, a global data IO signal line GIO-1 of global data signal lines GIO-1 to GIO-3 which are connected to the local data IO signal lines LIO above the second memory cell array 22 region extends from the IO control circuit 40, passes over the peripheral circuit 10, takes a U-like turn above the column decoder 30 region and extends to the second memory cell array 22 region from the column decoder 30 region to be connected to the local data IO lines LIO above the second memory cell array 22 region. The rest of the global IO signal lines GIO-0, GIO-2 and GIO-3 are arranged in the same or similar way as those of FIG. 2.

The signal line arrangement of FIG. 3, however, detours the global data IO signal line GIO-1 through the peripheral circuit 10 region rather than through the second memory cell array 22. It is to be understood by one of ordinary skill in the art that because the second memory cell array 22 region has a small layout area, this signal line arrangement can be used to alleviate drawbacks associated therewith.

Figure 4:
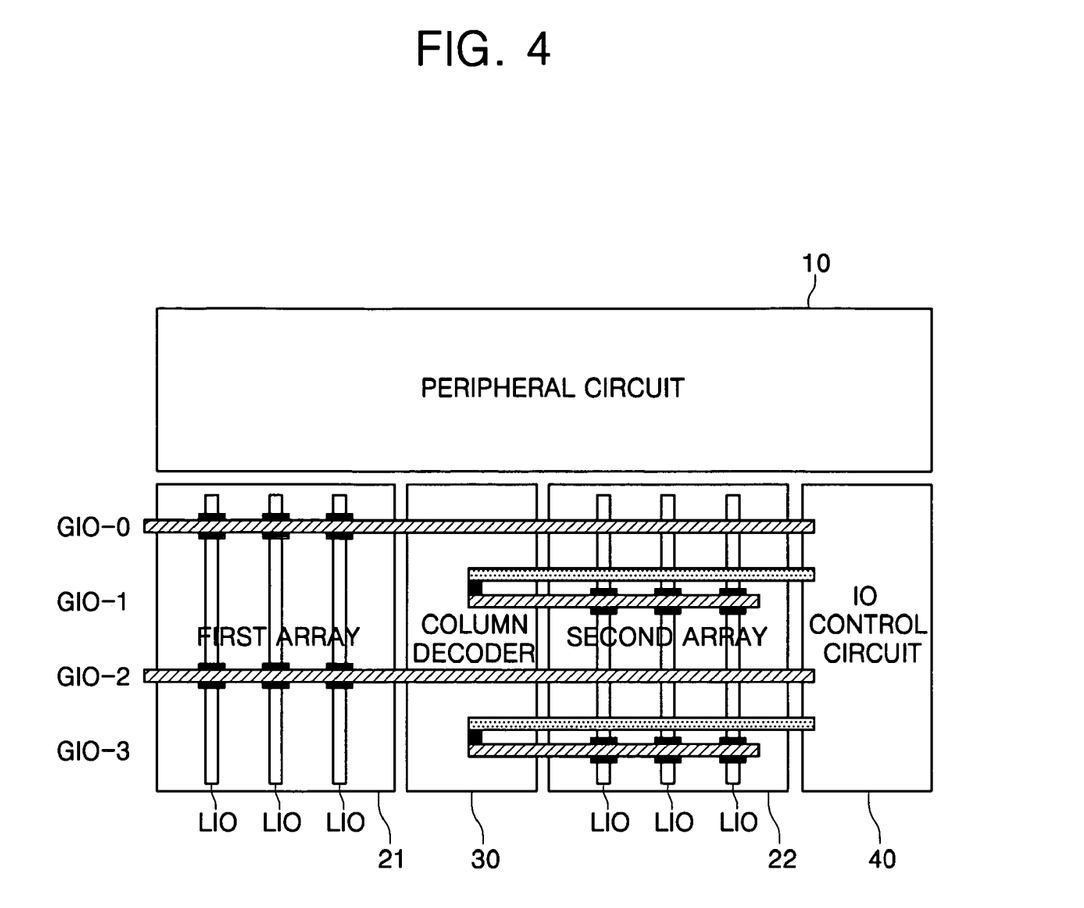
FIG. 4 is a schematic view illustrating a signal line arrangement of a semiconductor memory device according to a third exemplary embodiment of the present invention.

FIG. 4 is a schematic view illustrating a signal line arrangement of a semiconductor memory device according to a third embodiment of the present invention. The function and arrangement of a peripheral circuit 10, first and second memory cell arrays 21 and 22, and 10 control circuit 40 of FIG. 4 are the same or similar to those described above with reference to FIG. 1. In addition, the local data IO signal lines LIO of FIG. 4 are arranged in the same or similar fashion as shown in FIG. 1. As in FIG. 1, non-hatched signal lines are arranged on the first layer and hatched signal lines are arranged on the second layer. Signal lines filled with dots in FIG. 4 are arranged on a third layer.

As shown in FIG. 4, global data IO signal lines GIO-1 and GIO-3 which are connected to the local data IO signal lines LIO above the second memory cell array 22 region are arranged such that portions which extend from the IO control circuit 40 to the column decoder 30 region without being connected to the local data IO signal lines LIO are arranged on the third layer. The rest of the global data IO signal lines GIO-0 and GIO-2 are arranged in the same or similar way as those of FIG. 2.

Because the signal line arrangement of FIG. 4 detours the global data IO signal lines GIO-1 and GIO-3 which are connected to the local data IO signal lines LIO above the second memory cell array 22 region using the third layer, a skew that occurs between data signals output therefrom can be removed while providing a device having the same or similar sized layout area as the conventional semiconductor memory device.

Figure 5:
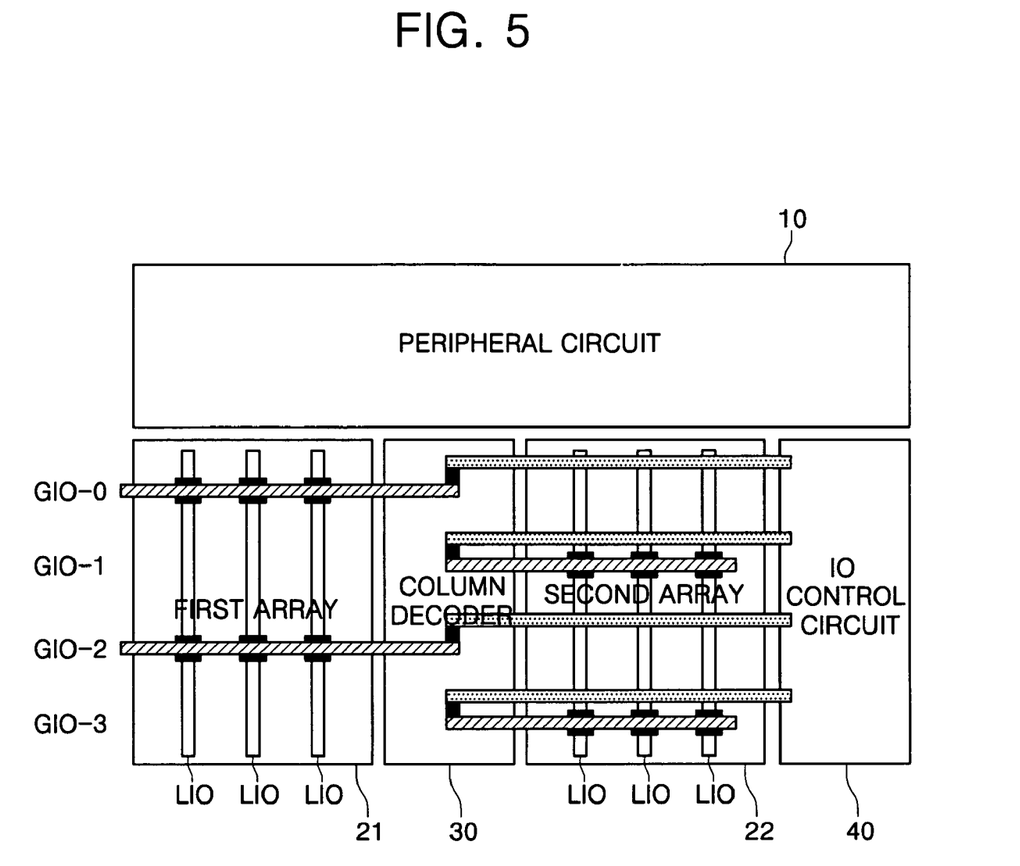
FIG. 5 is a schematic view illustrating a signal line arrangement of a semiconductor memory device according to a fourth exemplary embodiment of the present invention.

FIG. 5 is a schematic view illustrating a signal line arrangement of a semiconductor memory device according to a fourth embodiment of the present invention. The function and arrangement of a peripheral circuit 10, first and second memory cell arrays 21 and 22, and IO control circuit 40 of FIG. 5 are the same or similar to those described above with reference to FIG. 1. In addition, the local data IO signal lines LIO of FIG. 5 are arranged in the same or similar fashion as shown in FIG. 1. As in FIG. 1, non-hatched signal lines are arranged on the first layer and hatched signal lines are arranged on the second layer. Lines filled with dots in FIG. 5 are arranged on the third layer.

As shown in FIG. 5, global data IO signal lines GIO-0 and GIO-2 which are connected to the local data IO signal lines LIO above the first memory cell array 21 region are arranged such that portions corresponding to the second memory cell array 22 region are arranged on the third layer. The rest of the global data IO signal lines GIO-1 and GIO-3 are arranged in the same or similar way as those of FIG. 4.

The global data IO signal lines GIO-0 and GIO-2 which are connected to the local data IO signal lines LIO above the first memory cell array 21 region are arranged such that portions corresponding to the first memory cell array 21 region are arranged on the second layer and portions corresponding to the second memory cell array 22 region are arranged on the third layer.

The global data IO signal lines GIO-1 and GIO-3 which are connected to the local data IO signal lines LIO above the second memory cell array 22 region are arranged such that portions which extend from the IO control circuit 40 to the column decoder 30 region without being connected to the local data IO signal lines LIO are arranged on the third layer, and portions which extend from the column decoder 30 region to the second memory cell array 22 region to be connected to the local data IO signal lines LIO above the second memory cell array 22 region are arranged on the second layer.

When the global data IO signal lines arranged on the second layer and the global data IO signal lines arranged on the third layer have the same length as shown, for example, in FIGS. 4 and 5, a skew between data signals thereof is more effectively removed as compared to when the global data IO signal lines are arranged on the same layer.

According to an exemplary embodiment of the present invention, a skew can be removed between data signals transmitted through global data IO signal lines. In addition, when the column decoder 30 is arranged between the first memory cell array 21 and the second memory cell array 22 as shown in FIGS. 2-5, the global data IO signal lines can be prevented from being precharged before the column selecting signal is disabled. Further, it is to be understood by one of ordinary skill in the art that the global data IO signal lines arranged on the first to third layers may be made of a variety of metals.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device including a first memory cell array, an IO control circuit and a second memory cell array arranged between the first memory cell array and the IO control circuit, comprising:

first local data IO signal lines arranged above the first memory cell array;

second local data IO signal lines arranged on the same layer and in the same direction as the first local data IO signal lines above the second memory cell array;

first global data IO signal lines connected to the first local data IO signal lines and arranged in a perpendicular direction to the first and second local data IO signal lines to extend from the first memory cell array to the IO control circuit; and second global data IO signal lines connected to the second local data IO signal lines arranged to extend from one side of a region of the second memory cell array adjacent to the IO control circuit to an opposite side of the second memory cell array region and from the opposite side of the second memory cell array region back to the IO control circuit, wherein the first and second global data IO signal lines are arranged on different layers than the first and second local data IO signal lines, wherein the first global data IO signal lines are arranged such that portions above a region of the first memory cell array are arranged on the same layer as portions of the second global data IO signal lines extending back to the IO control circuit from the opposite side of the second memory cell array region and portions above the second memory cell array region are arranged on a different layer than portions of the second global data IO signal lines extending from the side of the second memory cell array region adjacent to the IO control circuit.

2. The device of claim 1, wherein the first and second global data IO signal lines are arranged on the same layer.

3. The device of claim 1, further comprising:
a peripheral circuit arranged on one side of the first and second memory cell arrays and the IO control circuit, wherein a portion of one of the second global data IO signal lines beginning from the opposite side of the second memory cell array region extends back to the IO control circuit through a region of the peripheral circuit.

4. The device of claim 1, further comprising:
a column decoder for outputting a column selecting signal in response to an external address signal, wherein the column decoder is arranged between the first and second memory cell arrays.

5. A semiconductor memory device including a first memory cell array, an IO control circuit and a second memory cell array arranged between the first memory cell array and the IO control circuit, comprising:
first local data IO signal lines arranged above the first memory cell array;
second local data IO signal lines arranged on the same layer and in the same direction as the first local data IO signal lines above the second memory cell array;
first global data IO signal lines connected to the first local data IO signal lines and arranged in a perpendicular direction to the first and second local data IO signal lines to extend from the first memory cell array to the IO control circuit; and
second global data IO signal lines connected to the second local data IO signal lines arranged to extend from one side of a region of the second memory cell array adjacent to the IO control circuit to an opposite side of the second memory cell array region and from the opposite side of the second memory cell array region back to the IO control circuit,
wherein the first and second global data IO signal lines are arranged on different layers than the first and second local data IO signal lines,
wherein the second global data IO signal lines are arranged such that portions of the second global data IO signal lines extending from the side of the second memory cell array region adjacent to the IO control circuit and portions of the second global data IO signal lines extending back to the IO control circuit from the opposite side of the second memory cell array region are arranged on different layers.

6. The device of claim 5, wherein the first global IO lines are arranged on the same layer as the portions of the second global data IO signal lines extending from the side of the second memory cell array region adjacent to the IO control circuit.

7. The device of claim 5, wherein the first global data IO lines are arranged on the same layer as the portions of the second global data IO signal lines extending back to the IO control circuit from the opposite side of the second memory cell array region.

8. The device of claim 5, wherein the first global data IO signal lines are arranged such that portions above a region of the first memory cell array are arranged on the same layer as the portion of the second global data IO signal lines extending back to the IO control circuit from the opposite side of the second memory cell array region and portions above the second memory cell array region are arranged on the same layer as the portion of the second global data IO signal lines extending from the side of the second memory cell array region adjacent to the IO control circuit.

9. A method for arranging signal lines of a semiconductor memory device including a first memory cell array, an IO control circuit and a second memory cell array arranged between the first memory cell array and the IO control circuit, comprising:
arranging first local data IO signal lines above the first memory cell array;
arranging second local data IO signal lines above the second memory cell array in the same direction and in the same direction as the first local data IO signal lines;
arranging first global data IO signal lines connected to the first local data IO signal lines in a perpendicular direction to the first and second local data IO signal lines from the first memory cell array to the IO control circuit; and
arranging second global data IO signal lines connected to the second local data IO signal lines to extend from one side of a region of the second memory cell array adjacent to the IO control circuit to an opposite side of the second memory cell array region and from the opposite side of the second memory cell array region back to the IO control circuit,
wherein the first and second global data IO signal lines are arranged on a different layer than the first and second local data IO signal lines,
wherein the first global data IO signal lines are arranged such that portions above a region of the first memory cell array are arranged on a different layer from portions of the second global data IO signal lines extending back to the IO control circuit from the opposite side of the second memory cell array region and portions above the second memory cell array region are arranged on the same layer as portions of the second global data IO signal lines extending from the side of the second memory cell array region adjacent to the IO control circuit.

10. The method of claim 9, wherein the first and second global data IO signal lines are arranged on the same layer.

11. The method of claim 9, further comprising:
arranging a peripheral circuit having a row decoder on one side of the first and second memory cell arrays and the IO control circuit, wherein a portion of one of the second global data IO signal lines beginning from the opposite side of the second memory cell array region extends back to the IO control circuit through a region of the peripheral circuit.

12. The method of claim 9, further comprising:
arranging a column decoder for outputting a column selecting signal in response to an external address signal between the first and second memory cell arrays.

13. A method for arranging signal lines of a semiconductor memory device including a first memory cell array, an IO control circuit and a second memory cell array arranged between the first memory cell array and the IO control circuit, comprising:

arranging first local data IO signal lines above the first memory cell array;

arranging second local data IO signal lines above the second memory cell array in the same direction and in the same direction as the first local data IO signal lines;

arranging first global data IO signal lines connected to the first local data IO signal lines in a perpendicular direction to the first and second local data IO signal lines from the first memory cell array to the IO control circuit; and arranging second global data IO signal lines connected to the second local data IO signal lines to extend from one side of a region of the second memory cell array adjacent to the IO control circuit to an opposite side of the second memory cell array region and from the opposite side of the second memory cell array region back to the IO control circuit, wherein the first and second global data IO signal lines are arranged on a different layer than the first and second local data IO signal lines, wherein the second global data IO signal lines are arranged such that portions of the second global data IO signal lines extending from the side of the second memory cell array region adjacent to the IO control circuit and portions of the second global data IO signal lines extending back to the IO control circuit from the opposite side of the second memory cell array region are arranged on different layers.

14. The method of claim 13, wherein the first global data IO lines are arranged on the same layer as the portions of the second global data IO signal lines extending from the side of the second memory cell array region adjacent to the IO control circuit.

15. The method of claim 13, wherein the first global data IO lines are arranged on the same layer as the portions of the second global data IO signal lines extending back to the IO control circuit from the opposite side of the second memory cell array region.

16. The method of claim 13, wherein the first global data IO signal lines are arranged such that portions above a region of the first memory cell array are arranged on the same layer as the portion of the second global data IO signal lines extending back to the IO control circuit from the opposite side of the second memory cell array region and portions above the second memory cell array region are arranged on the same layer as the portion of the second global data IO signal lines extending from the side of the second memory cell array region adjacent to the IO control circuit.

* * * * *